United States Patent [19]
Azar

[11] Patent Number: 6,055,154
[45] Date of Patent: Apr. 25, 2000

[54] IN-BOARD CHIP COOLING SYSTEM

[75] Inventor: Kaveh Azar, Westwood, Mass.

[73] Assignee: Lucent Technologies Inc., Murray Hill, N.J.

[21] Appl. No.: 09/118,674

[22] Filed: Jul. 17, 1998

[51] Int. Cl.⁷ .................................................. H05K 7/20
[52] U.S. Cl. ...................... 361/688; 361/699; 361/704; 361/720; 361/773; 165/80.3; 165/104.33; 257/713; 257/719; 174/252
[58] Field of Search .................. 361/687–689, 361/690, 704, 705, 697, 699, 710, 717, 719, 720–722; 165/80.2, 80.3, 80.4, 104.32, 104.33, 133, 185; 257/706–727, 731, 789, 796, 712, 713, 714, 678, 722; 62/259.2; 174/16.3, 252, 200

[56] References Cited

U.S. PATENT DOCUMENTS

| | | | |
|---|---|---|---|
| 4,154,294 | 5/1979 | Notaro | 165/133 |
| 5,043,845 | 8/1991 | McDermott et al. | 361/705 |
| 5,316,075 | 5/1994 | Quon et al. | 165/80.4 |
| 5,349,498 | 9/1994 | Tanzer et al. | 361/689 |

*Primary Examiner*—Gerald Tolin
*Assistant Examiner*—Michael Datskovsky

[57] ABSTRACT

An integrated circuit chip cooling system includes a thermally conductive block on which the chip is directly mounted. The block is secured to a printed circuit board and is suspended into flowing coolant, with the chip being maintained out of contact with the coolant. The coolant is circulated to remove heat from the block.

17 Claims, 6 Drawing Sheets

IN-BOARD CHIP COOLING SYSTEM

This application is a continuation-in-part of copending application Ser. No. 08/709,566, filed Sep. 6, 1996.

BACKGROUND OF THE INVENTION

This invention relates to an improved high efficiency cooling system for an integrated circuit chip and, more particularly, to an improved indirect cooling system.

In recent years, there has been a rapid development of high power integrated circuit chips to meet increasing demands on performance and size of electronic systems. These chips have decreased in size while at the same time the number of elements on the chips has grown, resulting in an increase in heat generation. There thus exists a need for an improved cooling system for such an integrated circuit chip.

Cooling systems for electronics systems can be conveniently divided into two categories—air cooling and liquid cooling. For the majority of low to medium power electronic systems, air cooling is sufficient. Air cooling is relatively inexpensive and easy to incorporate into most system designs. For extremely low power systems, natural convection cooling may be used. In this approach, air movement is induced by thermal density variations caused by heating of the system, and this is sufficient to carry away excess heat. For systems with higher power levels, forced convection cooling may be used wherein a fan or blower enhances heat transfer coefficients. Enhancements to air cooling, such as increasing surface area by adding fins or analyzing air flow to optimize component placement, can be used for slightly higher power levels.

While air cooling is sufficient for most present day electronic systems, in the future air cooling will be inadequate to handle the expected power levels of the denser integrated circuit chips. Therefore, some form of liquid cooling will be required. Liquid cooling can be divided into two categories—direct and indirect. In direct cooling, the chip comes in direct contact with the coolant, whereas in indirect cooling, heat transfer is accomplished via the package and the chip does not contact the coolant. Of the two, direct cooling is by far the most effective, but selection of the coolant is difficult because it cannot be electrically conductive and coolant fouling due to chemical and mechanical contact reduces heat transfer efficiency. Thus, a need exists for an improved indirect liquid cooling system.

SUMMARY OF THE INVENTION

In accordance with the principles of this invention, there is provided a method for cooling an integrated circuit chip. The method comprises the steps of providing an integrated circuit chip, providing a block of a thermally conductive material having at one end thereof a planar surface, securing the chip to the planar surface in such manner as to allow heat transfer between the chip and block, providing at least one electrical circuit connection extending along the planar surface between an edge region of the block and the chip, providing a circuit board having an aperture for receiving at least a part of the block therethrough, providing at least one electrical circuit connection on a first side of the circuit board and extending to a connecting region adjacent the aperture, mounting the block to the circuit board with at least part of the block extending through the aperture, with the planar surface on a first side of the board, and with each of the at least one connection at the edge region of the block in contact with a respective one of the at least one connection at the connecting region of the board, providing a seal between the block and the board, providing a supply of flowing coolant, and partially immersing the block in the flowing coolant so that the planar surface and the chip remain out of contact with the flowing coolant.

In accordance with an aspect of this invention, the step of securing includes the step of providing between the chip and the block a film which has high thermal conductivity and low electrical conductivity.

In accordance with another aspect of this invention, the step of providing a block includes the step of texturing a surface of the block which is to be immersed so as to increase the immersed surface area for enhanced cooling capacity.

In accordance with a further aspect of this invention, the step of providing a block includes the step of choosing a material for the block which has higher thermal conductivity orthogonal to the planar surface than parallel to the planar surface.

A system for cooling an integrated circuit chip according to the principles of this invention comprises a block of thermally conductive material having a planar surface, an integrated circuit chip secured to the planar surface in such manner as to allow heat transfer and provide electrical isolation between the chip and the block, at least one first electrical circuit connection overlying the planar surface and extending between an edge region of the block and the chip, a circuit board having a first side, a second side and an aperture for receiving at least a part of the block therethrough from the first side to the second side, the block being mounted to the circuit board with at least part of the block extending through the aperture and with the planar surface being on the first side of the board, at least one second electrical circuit connection on the first side of the circuit board, each of the at least one second connection extending to a connecting region adjacent the aperture and in contact with a respective one of the at least one first connection at the edge region of the block, a seal between the block and the board, and a supply of flowing coolant, wherein the block is partially immersed in the flowing coolant with the block planar surface and the chip out of contact with the flowing coolant.

In accordance with yet another aspect of this invention, the system further includes a circuit board having first and second opposed parallel planar surfaces, and wherein the chip is adapted for connection to electrical circuitry on the first surface of the circuit board. The block is mounted to the circuit board with the block planar surface parallel to the circuit board first surface and with the block extending through the circuit board beyond the circuit board second surface. The circuit board is oriented with the circuit board second surface facing the coolant.

In accordance with still another aspect of this invention, the circuit board is formed with an aperture through which the block extends and the interface between the block and the periphery of the circuit board aperture is sealed to prevent leakage of coolant from the circuit board second surface to the circuit board first surface through the aperture.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
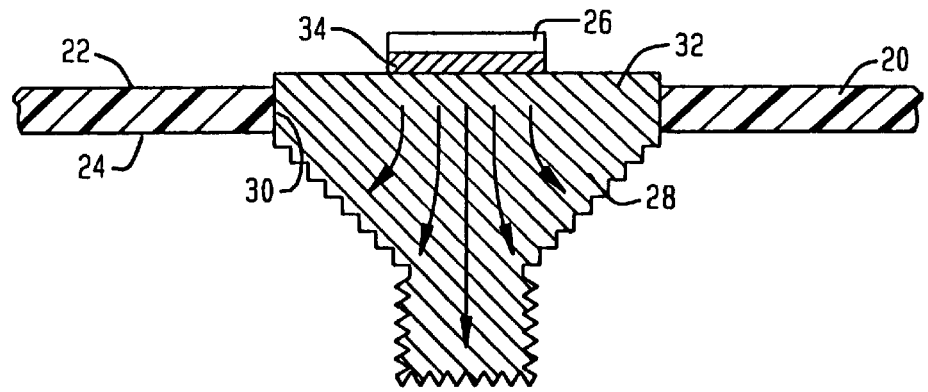
FIG. 1 conceptually illustrates a principal component for use in a cooling system constructed in accordance with the principles of this invention.

Referring now to the drawings, FIG. 1 illustrates a printed circuit board 20 having first and second opposed parallel planar surfaces 22, 24, respectively, which is adapted for having interconnected electrical circuitry and components on its first surface 22. One such component is the integrated circuit chip 26. According to the present invention, a block 28 of thermally conductive material is provided and which extends through an aperture 30 of the board 20. The block 28 has a planar surface 32 at one end thereof and the material of the block 28 is chosen preferably to have higher thermal conductivity in a direction orthogonal to the planar surface 32 than in a direction parallel to the planar surface 32. The chip 26 is directly attached to the surface 32 of the block 28. Preferably, a thin highly conductive interface film material 34 is interposed between the chip 32 and the block 28. The film 34 may be a diamond-like thin film which is applied by ion beam assisted deposition. The film 34 electrically insulates the chip 26 and the block 28 but presents little thermal resistance.

As shown, the block 28 extends through the printed circuit board 20 and has a root-like appearance. To enhance the cooling capacity of the block 28, the surface of the block 28 below the printed circuit board 20 is highly textured, illustratively by an ion beam process or by other techniques, such as machining or laser or waterjet cutting. Micro- or mini-groove, micro- or mini-pore or micro- or mini-fin surface enhancement can effectively increase the convective surface area by orders of magnitude. Further anodization of these surfaces can create a surface with emissivity close to unity. Although convective heat transfer is considered to be the prominent mode for heat removal, surfaces with high emissivity can potentially improve heat transfer by radiation. Furthermore, this type of surface enhancement can significantly improve boiling heat transfer if the power dissipation gets to a level that merits heat removal by boiling.

The block 28 is isolated from the printed circuit board 20 and other components on the printed circuit board 20 by providing a layer of non-conductive material (e.g., pure silicon) along the interface between the block 28 and the periphery of the aperture 30 to minimize thermal coupling between the components on the printed circuit board. This insulating material also functions as a sealant to prevent any liquid leakage of coolant to the chip 26, as will be described hereinafter.

Figure 2:
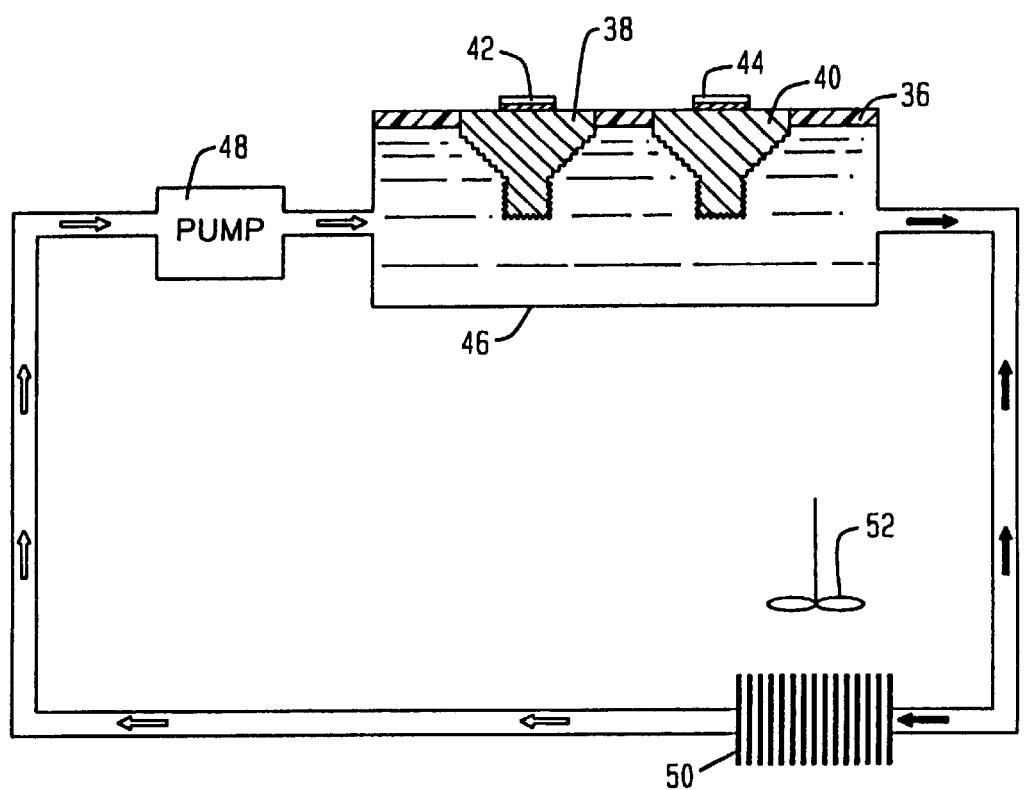
FIG. 2 schematically illustrates a cooling system according to the principles of this invention utilizing the component shown in FIG. 1.

The basic cooling system according to the present invention is schematically illustrated in FIG. 2. As shown, a printed circuit board 36 has mounted thereon a pair of blocks 38, 40, each with a respective integrated circuit chip 42, 44 secured thereto in the manner shown in FIG. 1. The printed circuit board 36 is supported over the flow chamber 46, which is filled with liquid coolant, illustratively water. The root-like extensions of the blocks 38, 40 extend into the liquid coolant while the chips 42, 44 are maintained out of contact with the liquid coolant. The flow chamber 46 is connected in a piping system for the liquid coolant, with a pump 48 being effective to circulate the liquid coolant through the flow chamber 46 and to a heat exchanger 50 of the liquid-air type, preferably including a forced air fan 52. Thus, as shown, cool liquid, as indicated by the hollow arrows, is circulated into the flow chamber 46 and the resultant heated liquid, as indicated by the filled-in arrows, is circulated out of the flow chamber 46 and into the heat exchanger 50. Thus, heat absorbed by the cooling liquid is ultimately transferred to the atmosphere via the heat exchanger 50.

Figure 4:
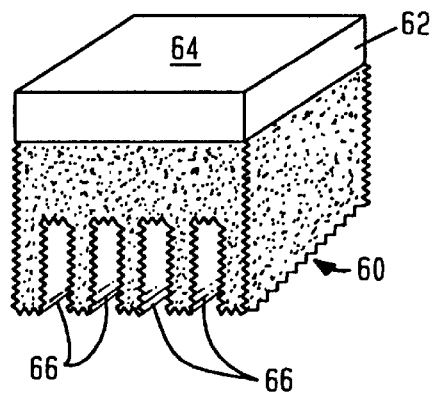
Figure 5:
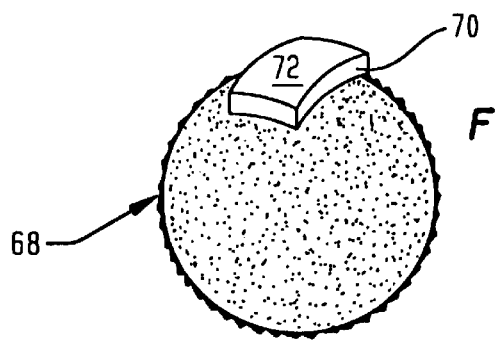

The design of the block, or "root", is an important consideration, since it provides a cooling tower for heat dissipation. The root system will be submerged in a liquid or will be exposed to a combination of jet impingement and submersion. In addition, the root must be fabricated from a highly conductive material which can be machined flat on one surface to accommodate mounting of an integrated circuit chip. The geometry of the block is an extremely important consideration for cooling. The ultimate geometrical design of the block must be such that the surface area in contact with the cooling liquid is maximized. This is in general a complex issue which must consider factors such as flow patterns around the root and ability of the geometry to withstand high fluid pressure. Exemplary block geometries are illustrated in FIGS. 3, 4 and 5.

Figure 3:
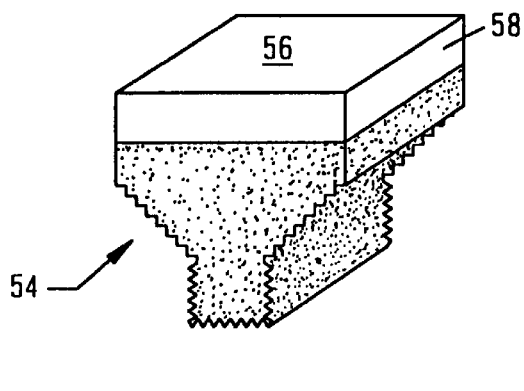
FIGS. 3, 4 and 5 are perspective views illustrating exemplary block geometries.

As shown in FIG. 3, an exemplary block 54 has an upper machined planar surface 56 above a slab-like portion 58 which is adapted for containment within a circuit board aperture. The remainder of the block 54 below the portion 58 is stepped and beveled with a highly textured surface to increase the immersed surface area of the block 54. The exemplary block 60 shown in FIG. 4 also includes a slab-like portion 62 topped by a planar surface 64. The immersed portion of the block 60 is formed with channels 66 and its surface is highly textured to increase the immersed surface area. The exemplary block 68 shown in FIG. 5 is generally spherical with a highly textured surface, having a slab-like portion 70 topped by a planar surface 72.

The material for the block should be selected to have high thermal conductivity, since it is essential that the path of least resistance to heat flow be through the root system. In order to minimize conductive coupling between the chips and through the printed circuit board, it would be desirable to choose a block material with planar thermal conductivity less than axial thermal conductivity. That is, the thermal conductivity orthogonal to the planar mounting surface is greater than the thermal conductivity parallel to the planar mounting surface. Material hardness and structural strength are also selection criteria, since the root is exposed to high fluid pressure. In addition, to provide sufficient surface area for convective and radiative cooling, the material's suitability for ion assisted texturing is desired. Finally, the material must be machinable, in order that a flat planar surface be provided for mounting of the chip. Exemplary block materials include ceramic, copper and diamond.

A limiting factor of direct or indirect cooling is interfacial thermal resistance. The proposed system attempts to overcome this obstacle by directly bonding the chip to the top of the block. A number of different techniques are possible to minimize thermal resistance as a function of bonding. Because the chip requires electrical isolation from the block, it is preferred to use a thin diamond-like film as part of the interfacial structure. Certain diamond-like films, as applied by ion assisted deposition, have thermal conductivities approaching that of diamond and high electrical resistivity. Other techniques, such as gold brazing, are used to form the bond between the film and the chip.

Figure 6:
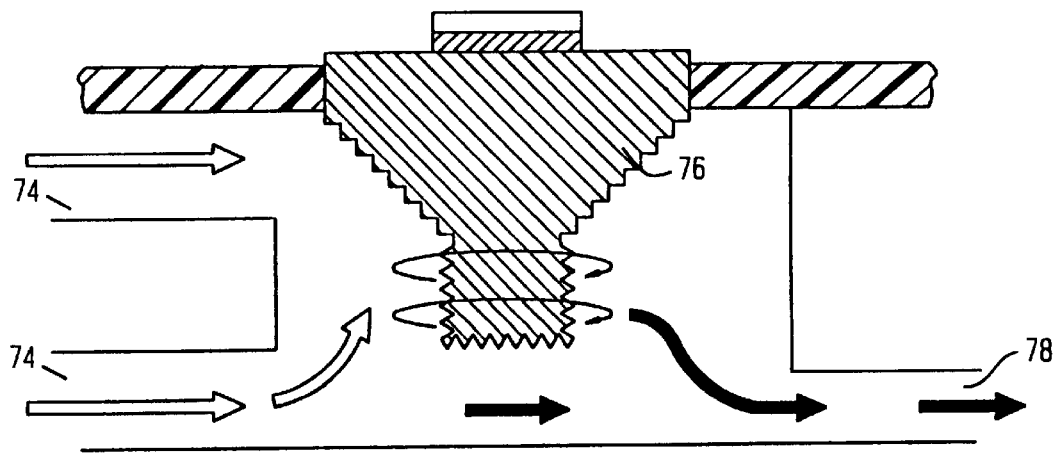
FIG. 6 illustrates the use of individual flow ducts for the blocks in the system of FIG. 2 to minimize thermal coupling via convective heat transfer.
Figure 7:
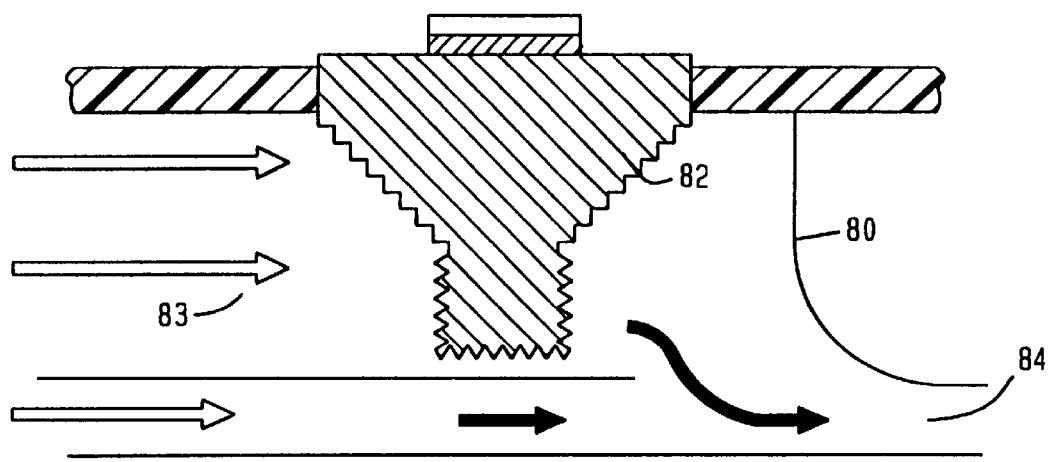
FIG. 7 illustrates a flow guide for the system of FIG. 2 for heated fluid diversion.

Thermal management of the proposed design requires that the primary path for heat transfer from the chip be through the root system and that thermal coupling by conduction through the printed circuit board material be eliminated. To eliminate or minimize thermal conductive coupling through the printed circuit board, thermal insulation between the root and the printed circuit board is provided. An insulating material is applied locally to the surface of the root. A typical candidate for such insulation material is pure silicon, which can easily be applied as a surface coating using a variety of physical vapor deposition techniques. Another avenue for thermal coupling is through the roots via convective heat transfer in the liquid coolant. Since all the roots are submerged in the same bath, the tendency for convective coupling maybe strong. FIG. 6 illustrates a first arrangement in the flow chamber to control this process. As shown therein, individual fluid flow inlet ducts 74 are provided for each block 76 and the heated liquid coolant is evacuated via an exhaust conduit 78. An alternative arrangement is illustrated in FIG. 7 wherein a dedicated flow guide 80 is positioned downstream from the block 82 and the inlet 83 to direct the flow to an exhaust conduit 84.

Figure 8:
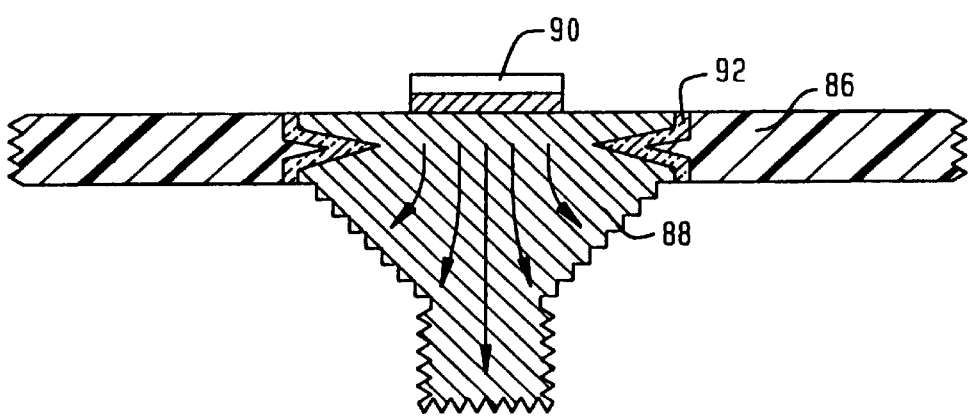
FIG. 8 illustrates a composite friction fit printed circuit board for use in the system of FIG. 2.
Figure 9:
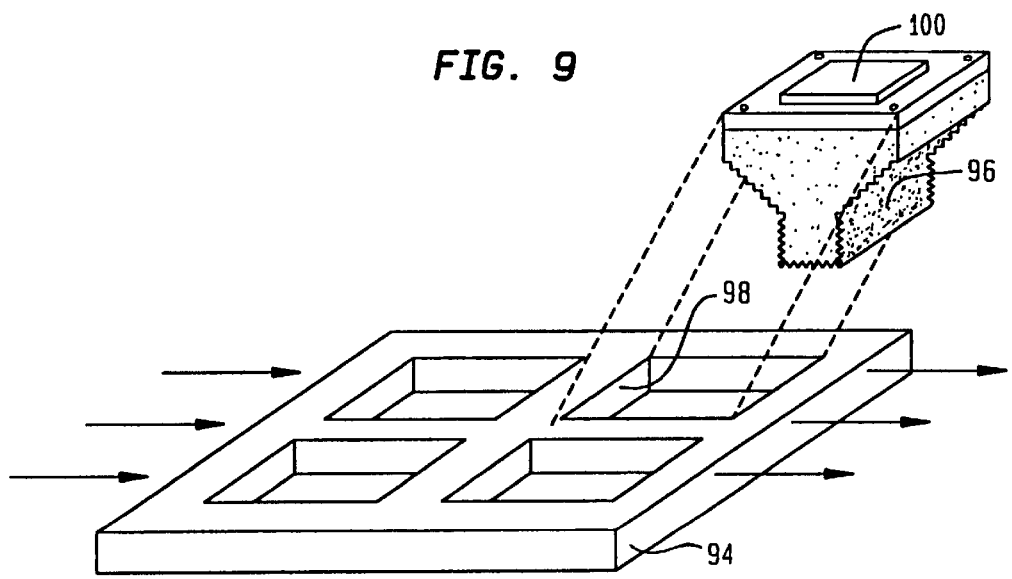
FIG. 9 illustrates a perforated printed circuit board for use in the system of FIG. 2.
Figure 10:
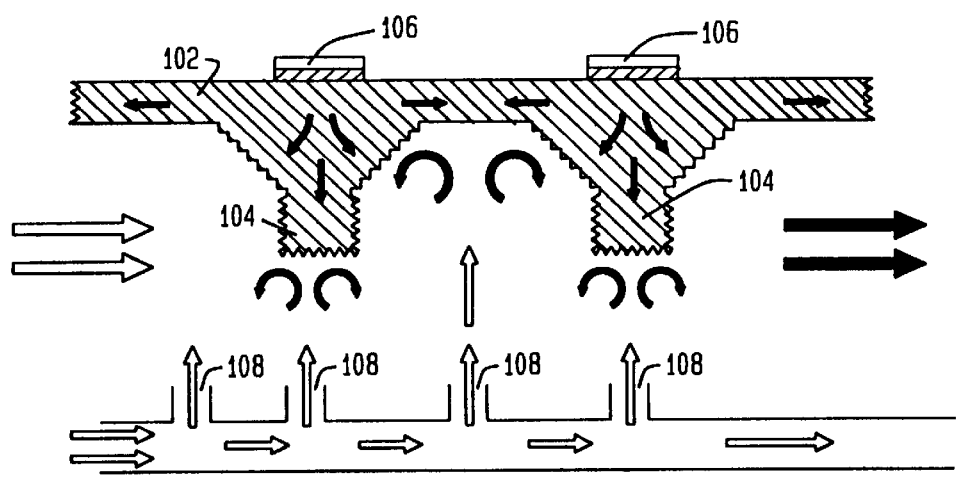
FIG. 10 illustrates a solid printed circuit board with unitary blocks and with multiple jet impingement for use in the system of FIG. 2.

A properly designed printed circuit board is also important, since the printed circuit board is where all electronic components, along with the root system, are placed. The printed circuit board and associated flow chamber must have minimal thermal coupling between the chips via the printed circuit board material and the printed circuit board must isolate the chips from the cooling fluid. FIGS. 8, 9 and 10 illustrate three alternative exemplary designs for a printed circuit board.

FIG. 8 illustrates a composite circuit board 86 wherein there is a friction and compression fit between the board 86 and the block 88. The motivation behind this design is to ensure that the chip 90 and the printed circuit board 86 are not thermally coupled. The design also ensures that the chip 90 is not in contact with the liquid coolant, so that water can be used as the coolant. By providing sealant 92 around the root system, along with the compression and frictional mode of mounting the roots, fluid leakage is eliminated. Although this type of printed circuit board provides flexibility in design and perhaps an ideal heat transfer condition, it may pose some manufacturing and operational difficulties. The primary issue is to ensure the flatness of the printed circuit board 86 for chip mounting purposes. Since a composite structure is being used for the board 86, ensuring flatness may be difficult from the manufacturing point of view, especially if there are many roots on the board. Furthermore, the fluid pressure may cause local or general buckling of the composite board 86 and adversely affect the reliability and operation of the electronic system.

FIG. 9 illustrates a perforated printed circuit board 94 which is perforated according to the component layout. The block 96 is inserted into an appropriate perforation 98 and then electrical connections are completed to the chip 100. In this case, the material of the circuit board 94 can become a rigid composite that does not buckle under fluid pressure. The blocks are mounted mechanically or by adhesives to the board 94. This design ensures a good degree of board flatness to accommodate electrical routing and mounting of the blocks. From the manufacturing point of view, it neither poses a significant degree of complexity nor requires development of new manufacturing technology or processes. However, depending upon the cooling fluid pressure, the roots may require mechanical mounting to the printed circuit board, which may reduce some valuable real estate on the board necessary for electrical routing. The roots in this case would be designed identically as described above. The surface area of contact between the roots and the printed circuit board would be thermally insulated and the interface between the roots and the printed circuit board would be sealed to ensure no coolant leakage from the flow chamber to the chips.

FIG. 10 illustrates a design wherein the board 102 and the roots 104 are unitarily constructed. This design does not require mounting of the roots since they are machined out of the printed circuit board. The rigid composite design printed circuit board shown in FIG. 10 is perhaps the most accommodating from the manufacturing point of view since both construction of the board and electrical routing are fairly straightforward. This design also eliminates the need for thermal insulation and liquid-proofing of the chips 106. Since the printed circuit board 102 is a rigid composite, surface flatness is not as important an issue as in the other proposed designs. The board 102 is manufactured from a material which is both highly thermally conductive and can be made flat for chip bonding and electrical routing. Although the design shown in FIG. 10 provides a lesser challenge from the manufacturing or mechanical design point of view, thermal control is critical. Since the root system and the printed circuit board are of the same material, and the heat exchanger design is based on highly conductive roots, thermal conduction coupling between the chips is a concern. A solution to this problem is to provide fluid jets 108 to provide local cool spots that carry the dissipated heat away from the board into the coolant.

Figure 11:
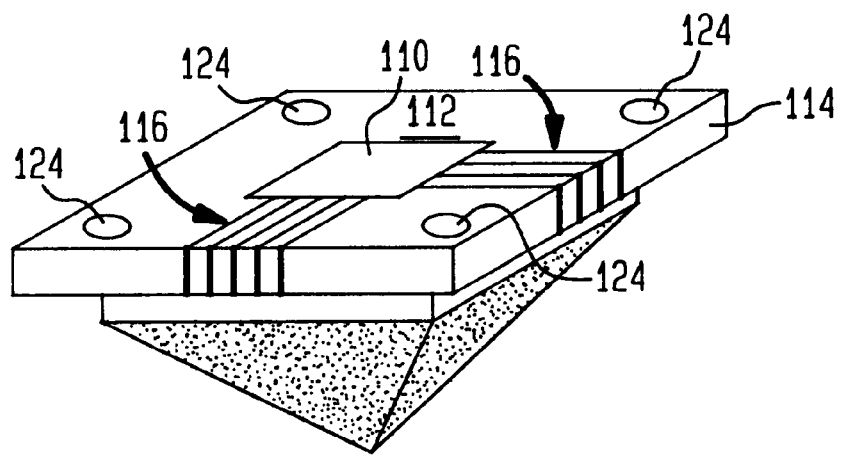
FIG. 11 illustrates an embodiment of a block showing circuit connections between the integrated circuit chip and an edge region of the block.
Figure 12:
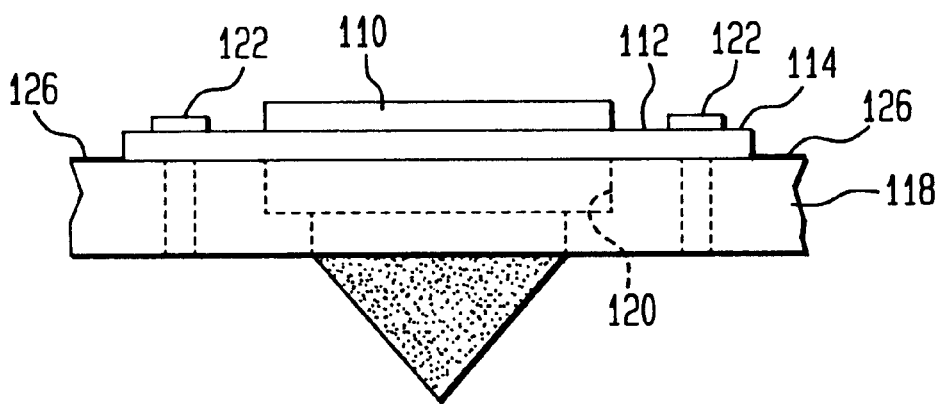
FIG. 12 illustrates an exemplary mounting of the block shown in FIG. 11 to a circuit board of the type shown in FIG. 9.

FIGS. 11–14 illustrate how circuit connections can be automatically made when a block having an integrated circuit chip mounted thereon is assembled to a circuit board of the type shown in FIG. 9. As shown in FIG. 11, the integrated circuit chip 110 is mounted to the planar surface 112 of the block 114 and circuit connections 116 are provided on the surface 112 between the integrated circuit chip 110 and an edge region of the block 114. As shown in FIG. 12, the block 114 is attached to the printed circuit board 118, which is of the type shown in FIG. 9. Thus, the block 114 extends through an aperture 120 in the printed circuit board 118 and is firmly secured thereto by fastening screws 122 which extend through apertures 124 in the block 114 and are threadedly received in the printed circuit board 118. As is conventional, circuit traces 126 are provided on the upper surface of the printed circuit board 118. These circuit traces are terminated in an area where they are in registration with, and contact, respective ones of the circuit connections 116 on the block 114. Thus, when the block 114 is attached to the printed circuit board 118, circuit connections are automatically effected. The circuit connections 116 on the block 114 can be formed by pads or solder joints on the underside of the block 114, by pins extending either vertically or horizontally from the block 114 to mate with corresponding receptacles on the circuit board 118, or by any other suitable arrangement.

Figure 13:
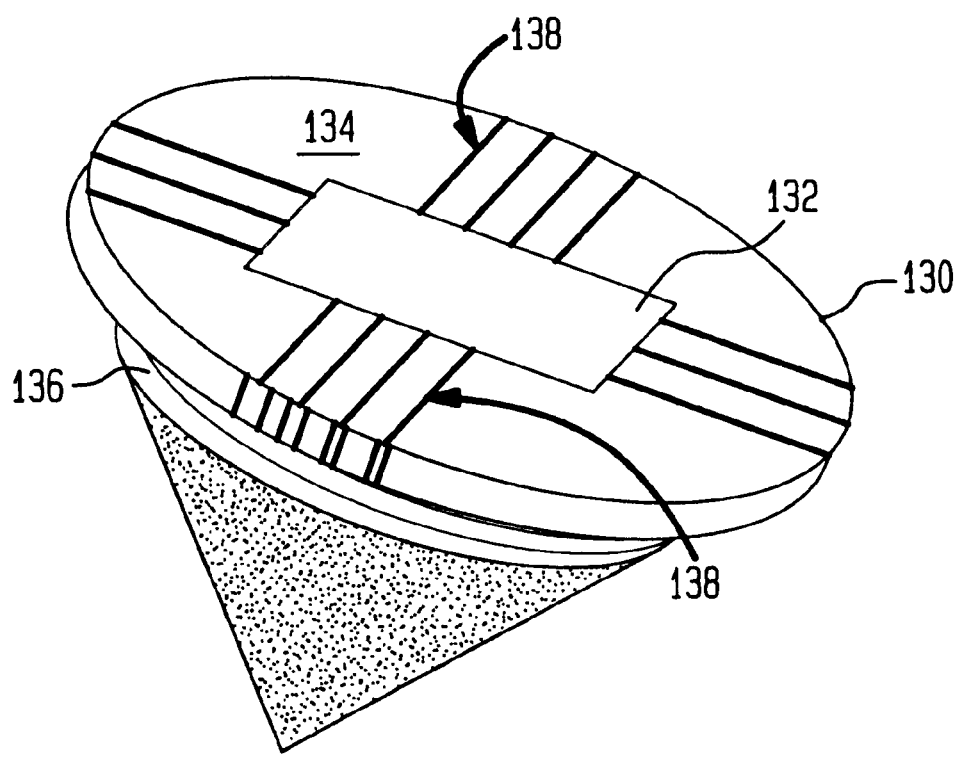
FIG. 13 illustrates another embodiment of a block showing circuit connections between the integrated circuit chip and an edge region of the block.
Figure 14:
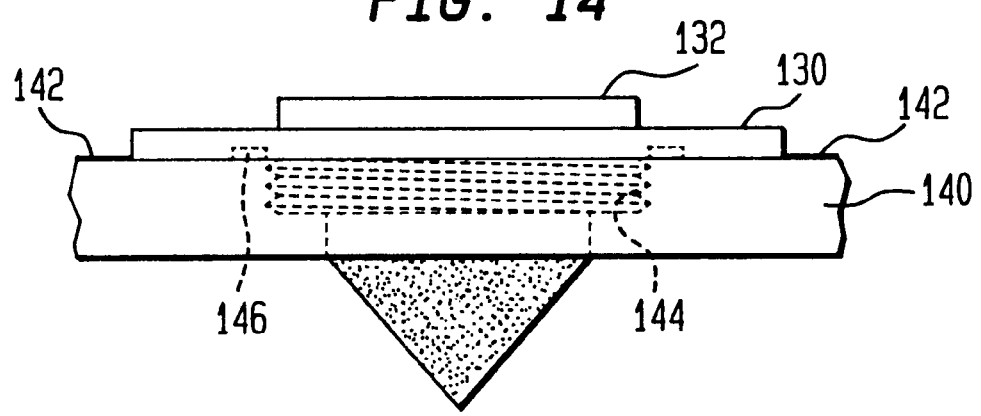
FIG. 14 illustrates an exemplary mounting of the block shown in FIG. 13 to a circuit board of the type shown in FIG. 9.

FIG. 13 illustrates a block 130 having an integrated circuit chip 132 on its planar surface 134 and which is threaded at 136 for attachment to a printed circuit board. Again, there are circuit connections 138 on the surface 134 which extend to an edge region of the block 130. As shown in FIG. 14, the printed circuit board 140 has circuit traces 142 on its upper surface and is formed with a suitably threaded aperture 144 for receiving the threaded block 130. The threads on the block 130 and in the aperture 144 are high precision threads which result in the block 130 attaining a predetermined orientation when securely attached to the circuit board 140, so that the circuit connections 138 of the block 130 connect with appropriate ones of the circuit traces 142 on the circuit board 140. In addition, a gasket 146 can be provided in a suitable groove on the underside of the block 130 so that when the block 130 is attached to the circuit board 140 appropriate sealing is attained.

Accordingly, there has been disclosed an improved indirect cooling system for integrated circuit chips. While various alternative illustrative embodiments have been disclosed herein, it is understood that various modifications and adaptations to the disclosed embodiments will be apparent to one of ordinary skill in the art and it is intended that this invention be limited only by the scope of the appended claims.

What is claimed is:

1. A method for cooling an integrated circuit chip, comprising the steps of:
   providing an integrated circuit chip;
   providing a block of a thermally conductive material having at one end thereof a planar surface;
   securing said chip to said planar surface in such manner as to allow heat transfer between said chip and said block;
   providing at least one electrical circuit connection extending along said planar surface between an edge region of said block and said chip;
   providing a circuit board having an aperture for receiving at least a part of said block therethrough;
   providing at least one electrical circuit connection on a first side of said circuit board and extending to a connecting region adjacent said aperture;
   mounting said block to said circuit board with at least part of said block extending through said aperture, with said planar surface on a first side of said board, and with each of said at least one connection at said edge region of said block in contact with a respective one of said at least one connection at said connecting region of said board;
   providing a seal between said block and said board;
   providing a supply of flowing coolant; and
   partially immersing said block in said flowing coolant so that said planar surface and said chip remain out of contact with said flowing coolant.

2. The method according to claim 1 wherein the step of securing includes the step of providing between said chip and said block a film which has high thermal conductivity and low electrical conductivity.

3. The method according to claim 1 wherein the step of providing a block includes the step of texturing a surface of the block which is to be immersed so as to increase the immersed surface area for enhanced cooling capacity.

4. The method according to claim 1 wherein the step of providing a block includes the step of making a material for the block which has higher thermal conductivity orthogonal to the planar surface than parallel to the planar surface.

5. The method according to claim 1 wherein the step of providing a supply of flowing coolant includes the step of guiding coolant after it has absorbed heat from said block directly to an exhaust conduit.

6. The method according to claim 1 wherein the step of providing a supply of flowing coolant includes the step of utilizing fluid jet means for directly impinging coolant at said block.

7. The method according to claim 1 wherein the step of providing a supply of flowing coolant includes the step of providing a supply of flowing liquid coolant.

8. A system for cooling an integrated circuit chip comprising:
   a block of thermally conductive material having a planar surface;
   an integrated circuit chip secured to said planar surface in such manner as to allow heat transfer and provide electrical isolation between said chip and said block;
   at least one first electrical circuit connection on said planar surface and extending between an edge region of said block and said chip;
   a circuit board having a first side, a second side and an aperture for receiving at least a part of said block therethrough from said first side to said second side, said block being mounted to said circuit board with at least part of said block extending through said aperture and with said planar surface being on said first side of said board;
   at least one second electrical circuit connection on said first side of said circuit board, each of said at least one second connection extending to a connecting region adjacent said aperture and in contact with a respective one of said at least one first connection at said edge region of said block;
   a seal between said block and said board; and
   a supply of flowing coolant adjacent said second side of said board;
   wherein said block is partially immersed in said flowing coolant with said block planar surface and said chip out of contact with said coolant.

9. The system according to claim 8 wherein a surface of said block which is immersed in said coolant is textured to increase the immersed surface area for enhanced cooling capacity.

10. The system according to claim 8 further including impingement means for directing at least a portion of said coolant flow at said block.

11. The system according to claim 8 further including a circuit board having first and second opposed parallel planar surfaces, wherein said chip is adapted for connection to electrical circuitry on said first surface of said circuit board and wherein:
   said block is mounted to said circuit board with said block planar surface parallel to said circuit board first surface and with said block extending through said circuit board beyond said circuit board second surface; and
   said circuit board is oriented with said circuit board second surface facing said coolant.

12. The system according to claim 11 wherein said circuit board is formed with an aperture through which said block extends and the interface between the block and the periphery of the circuit board aperture is sealed to prevent leakage of coolant from said circuit board second surface to said circuit board first surface through said aperture.

13. The system according to claim 12 wherein the sealed interface between the block and the periphery of the circuit board aperture is further effective to provide thermal insulation between the block and the circuit board.

14. The system according to claim 11 wherein said circuit board and said block are formed as a unitary structure.

15. The system according to claim 14 wherein said unitary structure includes a plurality of blocks formed unitarily with said circuit board and further including fluid jet impingement means for directing coolant at each of said plurality of blocks.

16. The system according to claim 11 wherein there are a plurality of chips and a plurality of blocks, each of said plurality of chips being secured to a respective one of said plurality of blocks, and further including:

a coolant flow chamber having an inlet duct, an exhaust conduit and a plurality of flow guides each associated with a respective one of said plurality of blocks for directing coolant from said respective block to said exhaust conduit.

17. The system according to claim 8 wherein the coolant is a liquid coolant.

* * * * *